(12) United States Patent
Miloslavskiy et al.

(10) Patent No.: US 11,329,504 B1
(45) Date of Patent: May 10, 2022

(54) PROACTIVE ENGINE START (PES)

(71) Applicant: ASCO Power Technologies, L.P., Florham Park, NJ (US)

(72) Inventors: Vladimir Miloslavskiy, Denville, NJ (US); Victor E. Bonachea, Elmwood Park, NJ (US)

(73) Assignee: ASCO Power Technologies, L.P., Florham Park, NJ (US)

( * ) Notice: Subject to any disclaimer, the term of this patent is extended or adjusted under 35 U.S.C. 154(b) by 0 days.

(21) Appl. No.: 17/349,238

(22) Filed: Jun. 16, 2021

(51) Int. Cl.
| | |
|---|---|
| *H02J 9/06* | (2006.01) |
| *H02J 13/00* | (2006.01) |
| *H03K 21/02* | (2006.01) |
| *H02J 3/00* | (2006.01) |

(52) U.S. Cl.
CPC ...... *H02J 13/00002* (2020.01); *H02J 3/0012* (2020.01); *H02J 9/068* (2020.01); *H03K 21/02* (2013.01); *H01H 2300/018* (2013.01); *Y04S 20/248* (2013.01)

(58) Field of Classification Search
CPC ............... H01H 2300/018; H02J 3/001; H02J 3/0012; H02J 9/00; H02J 9/04; H02J 9/06; H02J 9/068; Y04S 20/12; Y04S 20/20; Y04S 20/248
USPC ................. 307/64, 85, 86, 87, 112
See application file for complete search history.

(56) References Cited

U.S. PATENT DOCUMENTS

| | | | |
|---|---|---|---|
| 10,910,873 B2 | 2/2021 | Bonachea | |
| 2003/0090348 A1* | 5/2003 | Simms | H01H 89/06 335/6 |
| 2008/0100146 A1* | 5/2008 | Washington | H02J 9/06 307/130 |
| 2008/0100245 A1* | 5/2008 | Turner | H02P 23/14 318/437 |
| 2008/0100248 A1* | 5/2008 | Filippenko | H02P 6/182 318/466 |
| 2008/0116898 A1* | 5/2008 | Washington | H02P 7/00 324/521 |
| 2008/0179967 A1* | 7/2008 | Lathrop | H02J 9/061 307/130 |
| 2008/0180263 A1* | 7/2008 | Lathrop | H02J 9/06 340/635 |
| 2014/0132074 A1* | 5/2014 | Bush | H02J 9/06 307/66 |
| 2016/0065001 A1* | 3/2016 | Yasukawa | H02J 1/10 307/64 |
| 2017/0358946 A1* | 12/2017 | Bonachea | H02H 3/207 |

* cited by examiner

*Primary Examiner* — William Hernandez
(74) *Attorney, Agent, or Firm* — Locke Lord LLP (57) ABSTRACT

A method and system are provided for controlling transfer switch operations in a power distribution system. The method and system involve monitoring an electrical parameter of an electrical signal from a first power source associated with supplying power to a load; determining whether the electrical parameter satisfies a parameter threshold; selecting to increment or decrement a count value in accordance with the determination; and responsive to determining that the count value satisfies a first count threshold, initiating a start signal to start operation of a second power source to supply power to the load. The electrical parameter can be voltage or frequency, or other parameter(s) from which a power quality of the electrical signal may be evaluated. The electrical signal can be a single or polyphase electrical signal.

18 Claims, 5 Drawing Sheets

PROACTIVE ENGINE START (PES)

TECHNICAL FIELD

The present disclosure relates to a power management system and method, and more particularly, to a transfer switch system and method for predicting power conditions on a primary power source to facilitate proactive control of the start or stop operation of a secondary or backup power source in a power distribution system.

BACKGROUND

Power distribution systems are employed to provide electric power to operate equipment in various applications. These applications may require nearly constant supply of reliable electrical power to operate effectively. For example, hospitals may require a constant and reliable supply of electricity to ensure medical equipment in operating rooms and the like function when needed. Further, food retailers such as supermarkets and grocery stores may require a constant and reliable supply of electricity to properly operate refrigeration systems associated with display cases and freezers to prevent food spoilage.

While utility companies generally provide electrical power consistently and reliably, such power is sometimes interrupted due to inclement weather, unforeseen accidents, maintenance or other factors. Electrical power consumers seeking to mitigate or avoid even minor interruptions in their power supply often rely on generators and other backup systems to supply electrical power during periods when electrical service from a utility company is interrupted. Transfer switches enable these consumers to switch between a primary electrical source (e.g., from a utility company) and a secondary electrical source (e.g., a generator or other backup system) when one source becomes unreliable or requires maintenance.

SUMMARY

A method and system are provided for controlling operations in a power distribution system. The method and system involve monitoring an electrical parameter of an electrical signal from a first power source associated with supplying power to a load; determining whether the electrical parameter satisfies a parameter threshold; selecting to increment or decrement a count value in accordance with the determination; and responsive to determining that the count value satisfies a first count threshold, initiating a start signal to start operation of a second power source to supply power to the load. The electrical parameter can be voltage, frequency, or other parameter(s) from which a power quality of the electrical signal may be evaluated. The electrical signal can be a single or polyphase electrical signal.

In various embodiments, the count value can be incremented or decremented by an amount according to a value of the electrical parameter. The count value can be incremented if the electrical parameter of the electrical signal satisfies the parameter threshold, and can be decremented if the electrical parameter of the electrical signal does not satisfy the parameter threshold. An amount to increment the count value can be different from an amount to decrement the count value.

In a further embodiment, the parameter threshold can comprise a plurality of parameter threshold ranges having associated therewith different increment or decrement amounts. The determining operation can determine a parameter threshold range for the electrical signal from the plurality of parameter threshold ranges. The selecting operation can increment or decrement the count value by an amount associated with the determined parameter threshold range from the plurality of parameter threshold ranges.

In another embodiment, the action can comprise of initiating a start signal to start operation of a second power source for supplying power to the load. The method and system can further involve, after initiating the start signal, controlling a switch to transfer responsibility of supplying power to the load from the first power source to the second power source. In yet a further embodiment, the second power source can be connected to supply power to the load. The method and system can further involve continuing the performance of the monitoring, determining and selecting operations over time to update the count value; and when the count value satisfies a second count threshold, initiating a stop signal to stop operation of the second power source and controlling the switch to transfer responsibility of supplying power to the load from the second power source back to the first power source.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

Identical reference numerals have been used, where possible, to designate identical elements that are common to the figures. However, elements disclosed in one embodiment may be beneficially utilized on other embodiments without specific recitation.

DETAILED DESCRIPTION

The present disclosure is directed to a method and system for power management, such as controlling transfer switch operations and/or other power management operations. In a power distribution system, a power-quality measuring or monitoring device, such as for example, an automatic transfer switch, may detect a power outage condition for a primary power source and then responsively transfer the power supply to a load from the primary power source to a secondary or backup power source. However, the secondary power source takes time to turn ON, which may result in a discontinuous supply of power to the load when switching over from the primary power source to the secondary power source. The automatic transfer switch system of the present disclosure can employ a simple and effective approach, which also is light on memory usage and processor clock cycles, to predict power conditions on a primary power source (e.g., imminent power outage or failure, etc.) to facilitate proactive control of the start or stop operation of the secondary or backup power source and other transfer switch operations. The transfer switch system of the present disclosure can facilitate continuous supply of electric power by turning ON the secondary power source and switching to the secondary power source prior to an outage or other failure on the primary power source.

For example, in various embodiments, the transfer switch system of the present disclosure can employ a counting scheme to track a current state of the electric power supplied by the primary power source. In particular, a count value of a counter circuit is either incremented or decremented over time according to the acceptability or unacceptability of a monitored electrical parameter (e.g., voltage, frequency, etc.) of the electrical signal being supplied from the primary power source. A parameter threshold can be used to gauge the acceptability or unacceptability of the monitored electrical parameter. The count value can reflect a current operational state of the electric power supplied by the primary power source (e.g., reliable or unreliable), and a start-count threshold can be used to predict a likelihood of an imminent outage or failure of the primary power source. When the count value satisfies the start-count threshold, the automatic transfer switch system can automatically initiate an engine start signal to start the operation of the secondary power source (e.g., turn ON the power source or its engine), and implement other transfer switch operations to switchover the power supply to the load from the primary power source to the secondary power source.

In a further embodiment, a stop-count threshold also can be employed to predict when the electric power supplied by the primary power source is or has become reliable (or stable). When the count value satisfies the stop-count threshold, the automatic transfer switch system can automatically initiate an engine stop signal to stop the operation of the secondary power source (e.g., turn OFF the power source or its engine), and implement other transfer switch operations to switchover the power supply to the load from the secondary power source back to the primary power source.

These and other features of the present disclosure will be described in further detail below with reference to the example figures.

Figure 1:
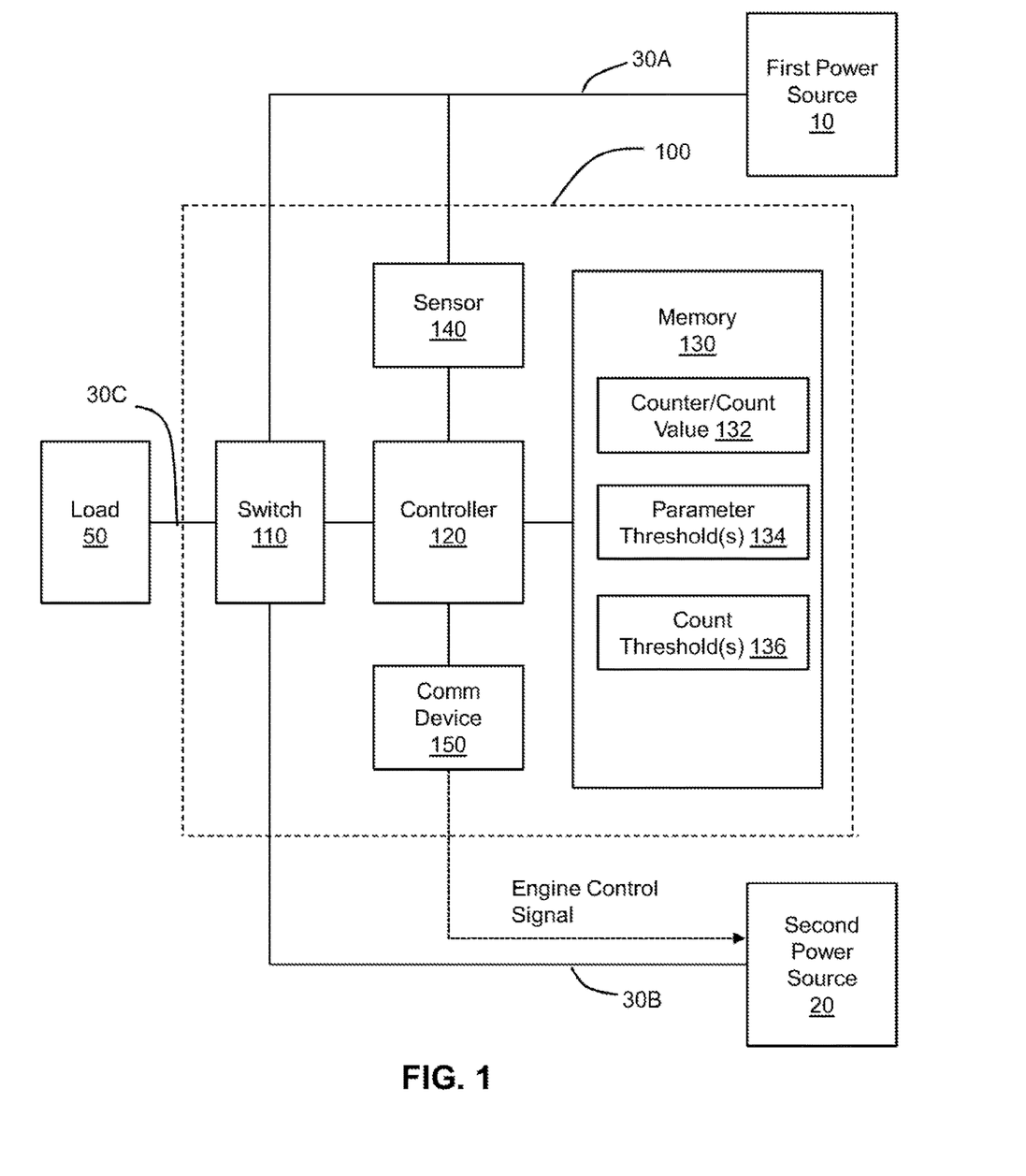
FIG. 1 is a block diagram illustrating an example automatic transfer switch system for switching a power supply to a load from one power source to another power source, in accordance with an embodiment.

FIG. 1 illustrates a block diagram of an example of an automatic transfer switch system 100, in accordance with an embodiment. The transfer switch system 100 can selectively couple a load 50 to either a first power source 10 or a second power source 20. For example, the first power source 10 can be a primary power source, and the second power source 20 can be a secondary power source. The primary power source can be provided by a power utility (e.g., via the electric grid) and the secondary power source can be provided by a backup generator(s) or other electric power generating system which needs to be turned ON (or the like) to operate. In other examples, the primary power source(s) and/or the secondary power source(s) can be other types of power supplies.

As shown in FIG. 1, the first power source 10 is coupled to the transfer switch system 100 via a first conductor 30A, the second power source 20 is coupled to the transfer switch system 100 via a second conductor 30B, and the transfer switch system 100 is coupled to the load 50 via an output conductor 30C. In general, the first power source 10 and the second power source 20 can provide electric power in the form of an electric signal. In various embodiments, the electric signal can, for example, be an alternating current (AC) voltage signal.

While the power sources 10 and 20, the conductors 30A through 30C, and the load 50 are shown as a single-phase system in FIG. 1, other configurations can be utilized in other examples. For instance, the power sources 10, 20, the conductors 30A through 30C, and/or the load 50 can be configured as a polyphase system in other examples, such as a three-phase system. In a single-phase system, the conductors 30A through 30C carry a single electric signal. In a three-phase system, three conductors 30A through 30C may each include multiple conductors to facilitate carrying three separate electric signals of the same frequency at different phases.

As further shown in FIG. 1, the transfer switch system 100 can include a switch(s) 110, controller(s) 120, memory 130, sensor(s) 140, and communication device(s) 150. The various components of the transfer switch system 100 may be interconnected via a bus system to facilitate communication therebetween.

The switch 110 can be operated to selectively connect the first power source 10 or the second power source 20 to the load 50. The switch 110 can include one or more electrical devices. For example, such additional electrical devices may comprise one or more electromechanical contactors, solid state devices, circuit breaker devices, and/or other suitable devices for electric power switching. In one example, the switch 110 can include a solenoid that activates an electrical contact to move between a connection to the first conductor 30A and a connection to the second conductor 30B. Other examples are also possible. For example, such electrical devices may be internal or external to the transfer switch system 100.

The switch 110 can be operably switched between multiple states. For example, in a first state, the switch 110 can connect the first power source 10 to the load 50. In a second state, the switch 110 can connect the second power source 20 to the load 50.

The controller 120 is configured to control the various components of the transfer switch system 100 and perform various operations associated with the switching of the power supply to a load from one power source to another power source. For example, the controller 120 can control the switch 110 to selectively switch between the first state and the second state. Therefore, the controller 120 may provide control signals to the switch 110, which selectively control the state of the switch 110 to connect either the first power source 10 or the second power source 20 to the load 50. The controller 120 can control the switch 110 based on an analysis of the electric signal transmitted on the first conductor 30A from the first source 10 to the load 50. In particular, the controller 120 can monitor the electric signal (or electrical parameters thereof) on the first conductor 30A for certain conditions over time, which can indicate that it may be beneficial to switch the load 50 from the first power source 10 to the second power source 20 (e.g., an outage or failure of the first power source 10 is likely to occur).

The controller 120 also can initiate engine control signals for controlling the operations of the second power source 20.

The control signals may include an engine start signal for starting operations of the second power source 20 (e.g., turn ON), and an engine stop signal for stopping operations of the second power source 20 (e.g., turn OFF or initiate SLEEP or STANDBY MODE). The controller 120 can initiate the engine start signal or engine stop signal based on a power quality analysis of the electric signal transmitted on the first conductor 30A from the first power source 10 to the load 50. In particular, the controller 120 can monitor the electric signal, particularly its electrical parameter(s), over time on the first conductor 30A for certain conditions, which indicate that it may be beneficial to start operation of the second power source 20 (e.g., an outage or failure of the first power source 10 is likely to occur), or stop operation of the second power source 20 (e.g., electric power supplied by the first power source 10 is or has become reliable or stable).

For example, in various embodiments, the controller 120 can employ a counter circuit with a count value, which is incremented or decremented according to the state of the monitored electrical parameter(s), to track certain conditions on the electrical power supply over time. The count value, which is updated over time, can help to predict a current operational state of the first power source 10, such as the reliability of the power source (e.g., stable) or the unreliability of the power source (e.g., unstable, imminent outage or failure of the power source, or etc.). The counter circuit can employ variable weights which increment or decrement based on the electrical parameter or value thereof. For example, the amount to increment or decrement the count value of the counter circuit can be based on a parameter threshold(s) for the monitored electrical parameter or value thereof. Based on the count value, the controller can proactively initiate an engine start or stop signal, control the switch 110 to change the source of the power supply (e.g., 10 or 20) to the load 50, and control or perform other operations as part of the transfer switching operations of the transfer switch system 100.

In particular, when electric power is supplied to the load 50 from the first power source and the count value satisfies a start-count threshold, the controller 120 can initiate the engine start signal and other transfer switch operations to switch the power supply to the load 50 from the first power source 10 to the second power source 20. When electric power is supplied from the second power source 20 and the count value satisfies a stop-count threshold, the controller 120 can initiate an engine stop signal and other transfer switch operations to switch the power supply to the load 50 from the second power source 20 back to the first power source 10. The control signals as well as other information may be communicated, via the communication device 150, to the second power source 20 or other devices or systems, under control of the controller 120.

To monitor the electric signal (and its electrical parameter(s)) on the first conductor 30A, the controller 120 is coupled to the first conductor 30A via the sensor 140. The sensor 140 may be internal (i.e., integral) or external to the controller 120. The sensor 140 can sense the electric signal transmitted on the first conductor 30A and provide an indication of one or more electrical parameters of the electric signal (e.g., a magnitude or frequency of current, voltage, power, etc.) to the controller 120. Various different types of sensors may be utilized. In one example, the sensor 140 can include a current transformer coupled to the first conductor 30A. In such an example, as current flows through the first conductor 30A, the current transformer induces a current in the sensor 140 that is proportional to the current flowing through the first conductor 30A. The sensor 140 and/or the controller 120 may then determine or derive, from the induced current, a voltage or current of the electric signal transmitted on the first conductor 30A from the first power source 10 to the load 50. Other examples are also possible. The transfer switch system 100 can include an additional one of sensor(s) 130, if desired, to monitor the electrical signal (and its electrical parameter(s)) on the second conductor 30B in a similar manner.

The controller 120 can be, for example, a processor such as a microcontroller, a microprocessor, an application specific integrated circuit (ASIC) device, field programmable gate array (FPGA), programmable logic controller (PLC) or other processing system or the like. In FIG. 1, the controller 120 is further communicatively coupled to the memory 130.

The memory 130 can store any data required by the controller 120 for detecting and predicting conditions of the primary power source 112, initiating a power transfer, or executing any other functionality including those described herein. For example, the memory 130 can store count value(s) 132 for a counter circuit(s), parameter threshold(s) 134, count threshold(s) 136, application code (e.g., main functionality firmware), initialization parameters, boot code, code for executing algorithms, code for monitoring, detecting, determining and/or predicting conditions of a power source, code for initiating engine start or stop signal, code for setting user defined thresholds for algorithms, check sums to determine whether code is corrupted, lock codes, and/or other data. This data can be stored in the memory 130 at the factory, manually entered via an input/output device (not shown), or remotely downloaded via the input/output device. The memory 130 can be integrated with the controller 120, or the memory 130 can be external and remotely coupled to the controller 120. The memory 130 can be, for example, random access memory (RAM), read only memory (ROM), electronic erasable programmable read only memory (EEPROM), flash memory, or other volatile or non-volatile memory (i.e., non-transitory computer readable media).

The parameter threshold 134 can include a voltage threshold(s), frequency threshold(s) or other different types of thresholds or conditions for use in categorizing an acceptability or unacceptability of a monitored electrical parameter of an electrical signal from a power source. The parameter threshold 134 can be expressed as a quantitative or qualitative threshold (or condition). While a single parameter threshold may be employed to differentiate an acceptable (e.g., good) or unacceptable (e.g., bad) state of a monitored electrical parameter, the parameter threshold may include a plurality of unacceptable parameter threshold ranges and/or a plurality of acceptable parameter threshold ranges to increase the sensitivity of the condition detection/prediction methodology. Different amounts or weights to increment/decrement the count value of the counter circuit can be associated with the plurality of different acceptable and unacceptable parameter threshold ranges.

The count threshold 136 can include a start-count threshold for initiating an engine start signal to start operation of a power source (or its engine), a stop-count threshold for initiating an engine stop signal to stop operation of a power source (or its engine), and other count thresholds for the count value to initiate other actions or predict other conditions. In various embodiments, the start-count threshold and the stop-count threshold may be the maximum or minimum value (or vice-a-versa) for the counter circuit.

The communication device 150 can be a transmitter, transceiver, signal circuit or other device, which is able to perform wireless or wireline communications with other remote devices or systems, including but not limited to the power sources (e.g., the second power source 20) and other equipment in a power distribution system. In some embodiments, the signal circuit can include a contact which can be opened or closed, under control of the controller 120, to initiate a desired signal to the second power source 20. For example, an engine start signal can be provided when the contact de-energizes and closes, and an engine stop signal can be provided when the contact energizes and opens.

Figure 2:
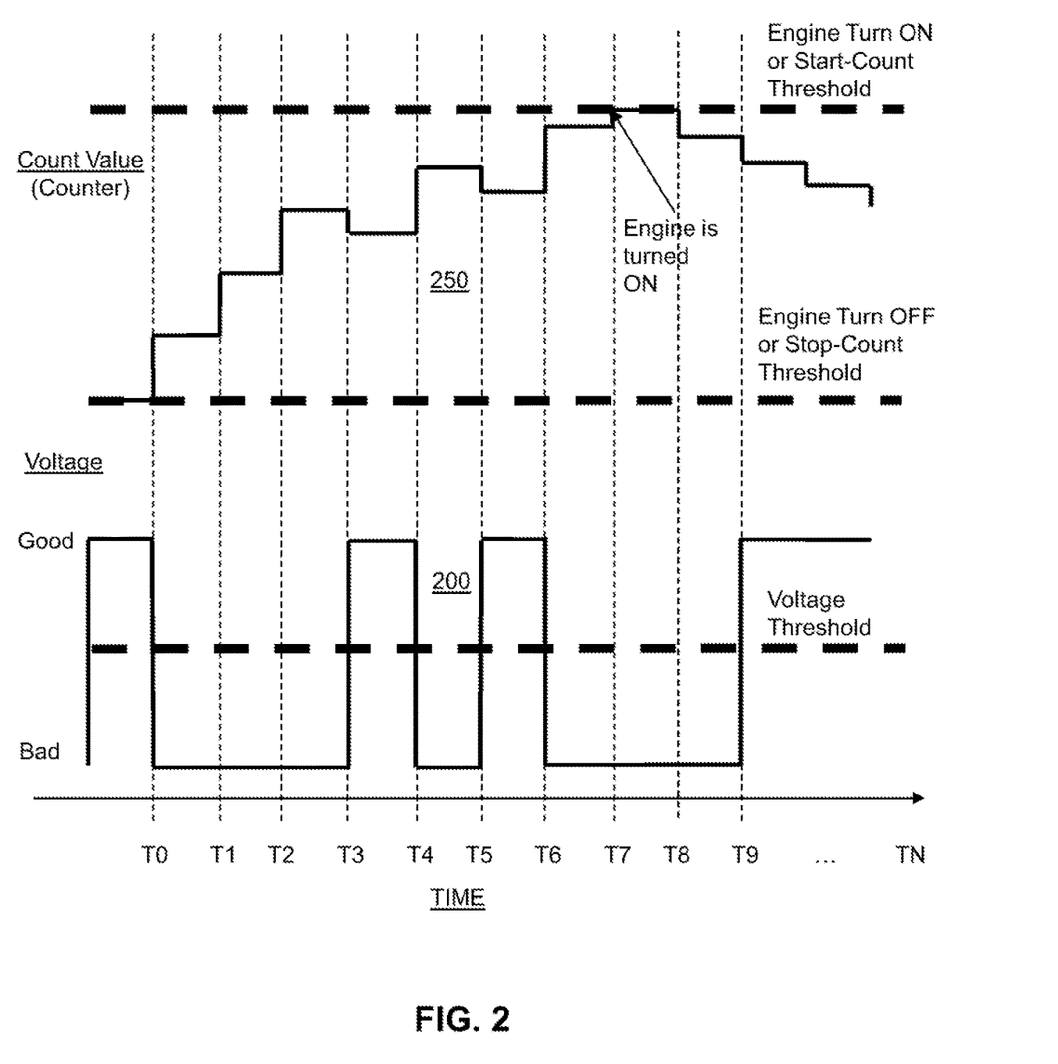
FIG. 2 are examples of two graphs, one of which illustrates a monitored electrical parameter of an electrical signal (e.g., voltage) from a power source over time, and the other of which illustrates a count value, which may change according to the monitored electrical parameter, over time, in accordance with an embodiment.

FIG. 2 illustrates a first graph 200 illustrating a monitored electrical parameter of an electrical signal from a power source over time, and a second graph 250 showing a count value, which may change over time according to the monitored electrical parameter, in accordance with an embodiment. Example transfer switch operations of the present disclosure will now be described with reference to FIG. 2.

In this example, a first power source (e.g., a primary power source) is initially supplying electric power to a load through an electrical signal, and the monitored electrical parameter of the electrical signal is voltage.

As shown in FIG. 2, at time T0, the electrical signal from the first power source is sampled by a sensor(s) and the magnitude of the voltage is monitored (e.g., sensed or derived) by a controller using the information from the sensor(s). The controller determines that the monitored voltage does not satisfy (or meet) the voltage threshold (e.g., an unacceptable or bad sample). Therefore, in this example, the controller increments the count value of the counter circuit by an amount for an unacceptable voltage at T0. At times T1 and T2, the controller determines that the monitored voltage of the electrical signal does not satisfy the voltage threshold, and thus, increments the count value at those times accordingly. At time T3, the controller determines that the monitored voltage satisfies the voltage threshold (e.g., an acceptable or good sample). Therefore, the controller decrements the count value of the counter circuit by an amount for an acceptable voltage. The controller continues to monitor the electrical parameter of the electrical signal over time versus the voltage threshold to update the count value of the counter circuit. For example, the controller increments the count value at time T4, decrements the count value at time T5, increments the count value at T6, and finally increments the count value at T7 such that the count value satisfies the start-count threshold. The satisfaction of the start-count threshold may indicate an imminent problem with the first power source (e.g., a power-flickering event, imminent power outage or failure, or so forth). When the start-count threshold is satisfied, the controller initiates the engine start signal to start operation of the second power source (e.g., a secondary power source) and implements other transfer switch operations including switching the power supply to the load from the first power source to the second power source, via a switch. The switching operation can be performed after a period of time (which can be predefined) when or after the second power source has started or is likely to start operation (e.g., turned ON).

In a further embodiment, the count value of the counter circuit can continue being updated (e.g., incremented or decremented) over time according to the monitored voltage of the electrical signal from the first power source. Should the count value satisfy the stop-count threshold, the controller can initiate the engine stop signal to stop operation of the second power source and implement other transfer switch operations including switching the power supply to the load from the second power source back to the first power source, via the switch. The stop-count threshold can be used to identify or predict the operational state of the first power source, e.g., when the first power source is or has become reliable or stable.

In the example of FIG. 2, the maximum count value and minimum count value can be the start-count threshold and the stop-count threshold, respectively. Furthermore, in this example, the incremented amount (e.g., 4) can be larger than the decremented amount or weighted differently than the decremented amount; however, the incremented or decremented amount can be determined, changed, or customized/tuned. For example, the incremented or decremented amount can be selected according to various factors, including but not limited to the application including the load applications, equipment including the power sources, behavior of the power source(s) based on the operational history of the power distribution system, and other information associated with the power distribution system. The parameter and count thresholds may also be determined, changed, or customized/tuned in a similar fashion. In various embodiments, the amounts to increment or decrement and/or the various thresholds can be set at the factory, set or changed by the user, or downloaded to the controller of the automatic transfer switch system, and selected to vary the sensitivity of the condition detection/prediction methodology as described herein.

While the above example of FIG. 2 monitors a voltage parameter, the automatic transfer switch system can be configured to implement the transfer switch operations, including the initiation of the start and stop signals, by monitoring other types of electrical parameters or a combination of electrical parameters for the electrical signal from a power source. For example, the other types of electrical parameters can include but is not limited to a frequency of the electrical signal in a polyphase system. The frequency threshold can be an acceptable or unacceptable differential threshold of the frequency between electrical signals of two different phases. The combination of electrical parameters can include voltage, frequency and/or other types of electrical parameters, and may have associated therewith parameter thresholds for the combined parameter or value thereof.

Figure 3:
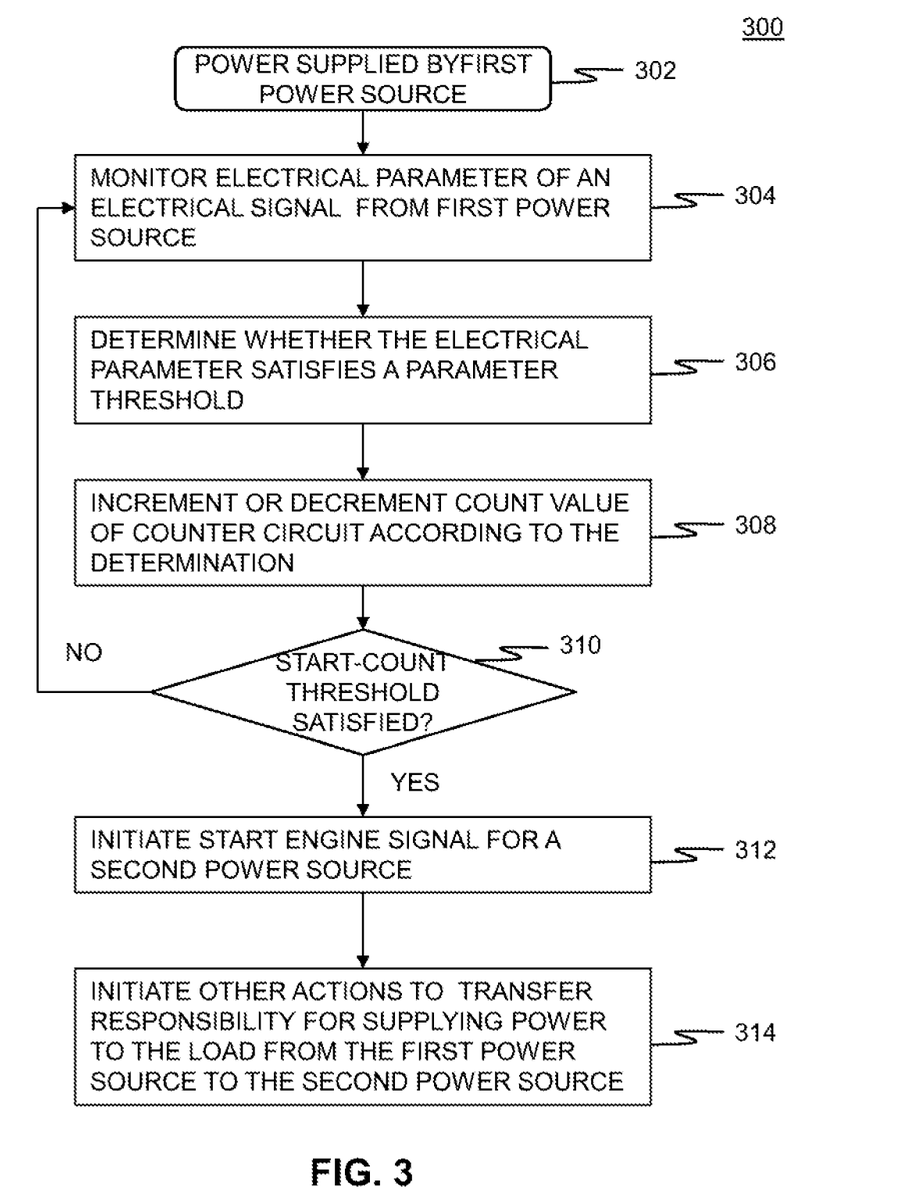
FIG. 3 is a flow chart illustrating example operations of a method by which an engine start signal is initiated to start a power source in a transfer switching scenario, in accordance with an embodiment.

FIG. 3 is a flow chart illustrating example operations of a method 300 by which an engine start signal is initiated to start a first power source (e.g., primary power source) in a power transfer scenario, in accordance with an embodiment. The method 300 begins at block 302, in which a first power source is supplying electric power, via an electrical signal, to a load. At block 304, a controller monitors an electrical parameter of the electrical signal from the first power source. For example, as previously discussed, the controller can monitor the electrical parameter using information sensed from one or more sensors. At block 306, the controller determines whether the electrical parameter satisfies a parameter threshold. At block 308, the controller increments or decrements a count value of a counter circuit, according to the determination. At block 310, the controller checks whether the count value satisfies the start-count threshold. If not, the method 300 returns back to block 304. Otherwise, if the count value satisfies the start-count threshold, the controller initiates a start engine signal to start operation of a second power source (e.g., a secondary power source), at block 312. At block 314, the controller can initiate other actions to transfer responsibility for supplying power to the load from the first power source to the second power source. These actions can include among other things switching over the power supply to the load from the first power source to the second power source, via a switch.

Figure 4:
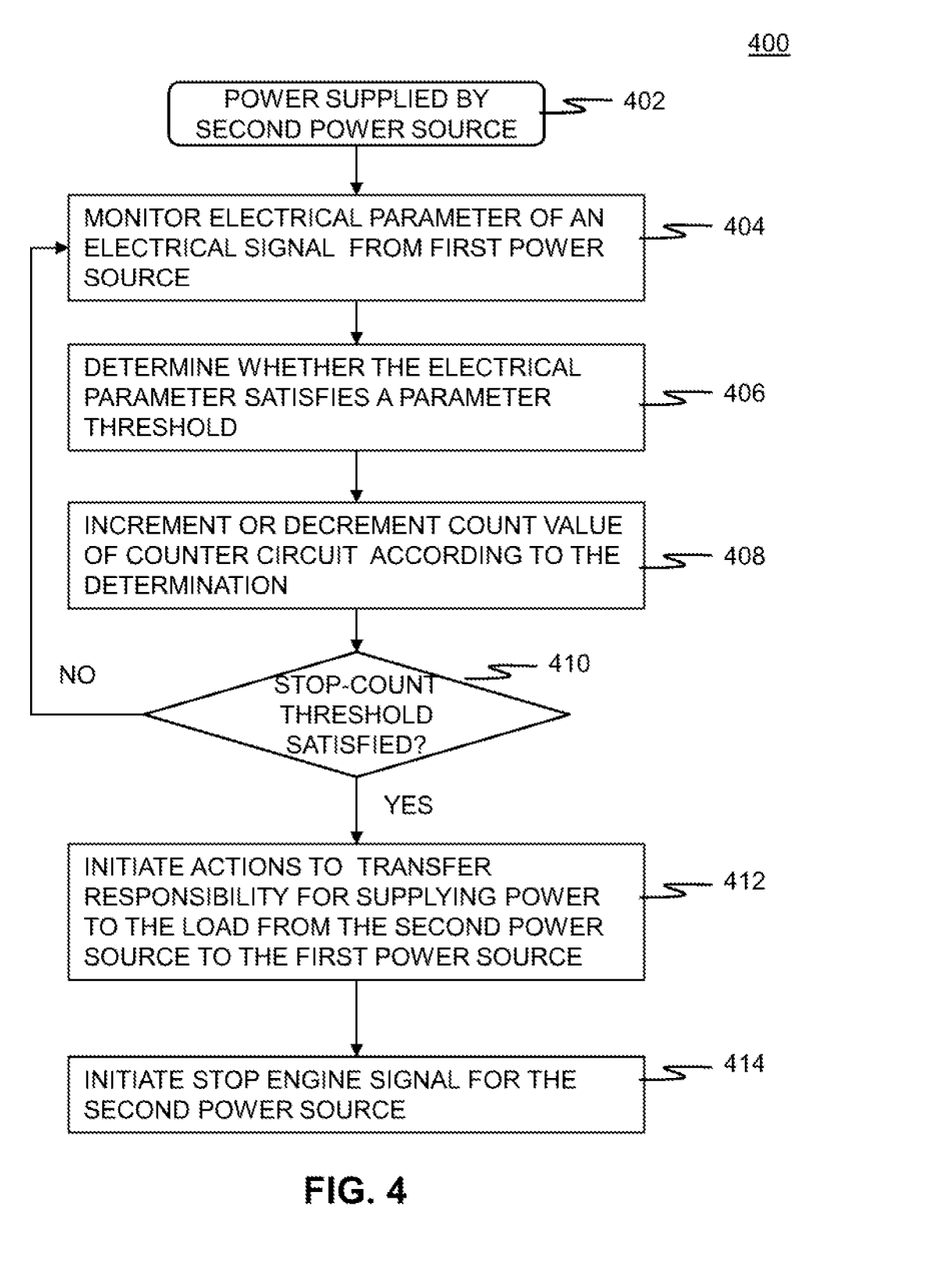
FIG. 4 is a flow chart illustrating example operations of a method by which an engine stop signal is initiated to stop a power source a transfer switching scenario, in accordance with an embodiment.

FIG. 4 is a flow chart illustrating example operations of a method 400 by which an engine stop signal is initiated to stop operation of a second power source (e.g., a secondary power source) in a power transfer scenario, in accordance with an embodiment. The method 400 begins at block 402, in which the second power source is supplying electric power to a load. At this time, first power source (e.g., a primary power source) is disconnected, via a switch, from supplying power to the load. At block 404, a controller monitors an electrical parameter of the electrical signal from the first power source. For example, as previously discussed the controller can monitor the electrical parameter using information sensed from one or more sensors. At block 406, the controller determines whether the electrical parameter satisfies a parameter threshold. At block 408, the controller increments or decrements a count value of a counter circuit, according to the determination. At block 410, the controller checks whether the count value satisfies the stop-count threshold. If not, the method 400 returns back to block 404. Otherwise, if the count value satisfies the stop-count threshold, the controller can initiate actions to transfer responsibility for supplying power to the load from the second power source back to the first power source at block 412. These actions can include among other things switching over the power supply to the load from the second power source back to the first power source, via the switch. At block 414, the controller initiates a stop engine signal to stop operation of the second power source, at block 412.

Figure 5:
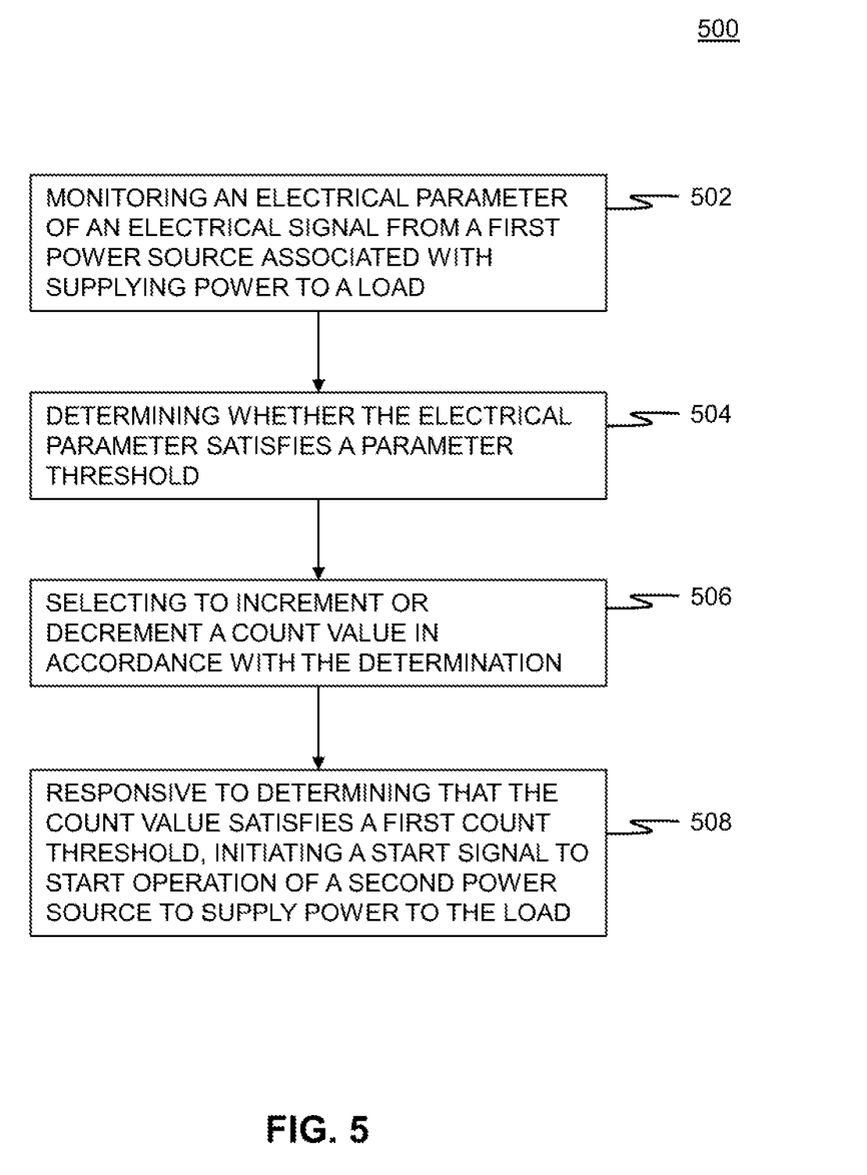
FIG. 5 is a flow chart illustrating an example method of controlling operations in a power distribution system, in accordance with an embodiment.

FIG. 5 is a flow chart illustrating an example method 500 of controlling operations in a power distribution system. The method 500 begins at block 502 in which a controller monitors an electrical parameter of an electrical signal from a first power source associated with supplying power to a load. At block 504, the controller determines whether the electrical parameter satisfies a parameter threshold. At block 506, the controller selects to increment or decrement a count value in accordance with the determination. At block 508, responsive to determining that the count value satisfies a first count threshold, the controller initiates a start signal to start operation of a second power source to supply power to the load.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

For example, it should be understood that the power quality monitoring, detection, and control features, described herein, can be implemented with devices or systems other than a transfer switch. Such devices or systems can include but is not limited to a circuit breaker, a power control system, an intelligent electronic device (IED) in a power distribution system or other devices or systems employed in a power distribution system. Furthermore, various actions can be initiated using the detection scheme, described herein, depending on the application. The actions can, for example, include initiating a control signal to disconnect a load by opening a circuit breaker, sending an alarm, or other action to be taken according to the detected power quality of the power supply.

In addition, the detection scheme, described herein, may also be implemented by monitoring electrical parameters (of an electrical signal) other than voltage or frequency. For example, other electrical parameters can include but is not limited to current, total harmonic distortion, flicker, power, or other parameter(s) from which a power quality of an electrical signal from a power source may be evaluated.

It should also be understood that the example embodiments disclosed and taught herein are susceptible to numerous and various modifications and alternative forms. Thus, the use of a singular term, such as, but not limited to, "a" and the like, is not intended as limiting of the number of items. Furthermore, the naming conventions for the various components, functions, characteristics, thresholds, and other elements used herein are provided as examples, and can be given a different name or label. The use of the term "or" is not limited to exclusive "or", but can also mean "and/or".

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. A method of controlling operations in a power distribution system, comprising:
    monitoring an electrical parameter of an electrical signal from a first power source associated with supplying power to a load;
    determining whether the electrical parameter satisfies a parameter threshold;
    selecting to increment or decrement a count value in accordance with the determination; and
    responsive to determining that the count value satisfies a first count threshold, initiating a start signal to start operation of a second power source to supply power to the load,
    wherein the count value is incremented if the electrical parameter of the electrical signal satisfies the parameter threshold, and is decremented if the electrical parameter of the electrical signal does not satisfy the parameter threshold.

2. The method according to claim 1, wherein the electrical parameter is voltage.

3. The method according to claim 1, wherein the count value is incremented or decremented by an amount according to a value of the electrical parameter.

4. The method according to claim 1, wherein an amount to increment the count value is different from an amount to decrement the count value.

5. The method according to claim 1, wherein the parameter threshold comprises a plurality of parameter threshold ranges having associated therewith different increment or decrement amounts, the determining operation determines a parameter threshold range for the electrical signal from the plurality of parameter threshold ranges, and the selecting operation increments or decrements the count value by an amount associated with the determined parameter threshold range from the plurality of parameter threshold ranges.

6. The method according to claim 1, further comprising after initiating the start signal, controlling a switch to transfer responsibility of supplying power to the load from the first power source to the second power source.

7. The method according to claim 6, wherein the second power source is connected to supply power to the load, the method further comprising:
    continuing the performance of the monitoring, determining and selecting operations over time to update the count value; and
    when the count value satisfies a second count threshold, initiating a stop signal to stop operation of the second power source and controlling the switch to transfer responsibility of supplying power to the load from the second power source back to the first power source.

8. The method according to claim 1, wherein the electrical signal comprises a polyphase electrical signal, and the electrical parameter is frequency.

9. A system for controlling operations in a power distribution system, comprising:
    a memory; and
    a processor, in communication with the memory, for:
        monitoring an electrical parameter of an electrical signal from a first power source associated with supplying power to a load;
        determining whether the electrical parameter satisfies a parameter threshold;
        selecting to increment or decrement a count value in accordance with the determination; and
        responsive to determining that the count value satisfies a first count threshold, initiating a start signal to start operation of a second power source to supply power to the load,
    wherein the count value is incremented if the electrical parameter of the electrical signal satisfies the parameter threshold, and is decremented if the electrical parameter of the electrical signal does not satisfy the parameter threshold.

10. The system according to claim 9, wherein the electrical parameter is voltage.

11. The system according to claim 9, wherein the count value is incremented or decremented by an amount according to a value of the electrical parameter.

12. The system according to claim 9, wherein an amount to increment the count value is different from an amount to decrement the count value.

13. The system according to claim 9, wherein the parameter threshold comprises a plurality of parameter threshold ranges having associated therewith different increment or decrement amounts, the processor determines a parameter threshold range for the electrical signal from the plurality of parameter threshold ranges, and the processor increments or decrements the count value by an amount associated with the determined parameter threshold range from the plurality of parameter threshold ranges.

14. The system according to claim 9, wherein the processor is further configured to control a switch to transfer responsibility of supplying power to the load from the first power source to the second power source, after initiating the start signal.

15. The system according to claim 14, wherein the second power source is connected to supply power to the load, the processor being further configured:
to continue the performance of the monitoring, determining and selecting operations over time to update the count value, and
when the count value satisfies a second count threshold, to initiate a stop signal to stop operation of the second power source and to control the switch to transfer responsibility of supplying power to the load from the second power source back to the first power source.

16. The system according to claim 9, wherein the electrical signal comprises a polyphase electrical signal, and the electrical parameter is frequency.

17. A non-tangible computer readable medium storing computer code, which when executed by a processor, implements a method of controlling operations in a power distribution system, comprising:
monitoring an electrical parameter of an electrical signal from a first power source associated with supplying power to a load;
determining whether the electrical parameter satisfies a parameter threshold;
selecting to increment or decrement a count value in accordance with the determination; and
responsive to determining that the count value satisfies a first count threshold, initiating a start signal to start operation of a second power source to supply power to the load,
wherein the count value is incremented if the electrical parameter of the electrical signal satisfies the parameter threshold, and is decremented if the electrical parameter of the electrical signal does not satisfy the parameter threshold.

18. The non-tangible computer readable medium according to claim 17, wherein the electrical signal comprises a polyphase electrical signal, and the electrical parameter is frequency.

* * * * *